US006824898B2

(12) United States Patent
Suzuki et al.

(10) Patent No.: US 6,824,898 B2
(45) Date of Patent: Nov. 30, 2004

(54) DIELECTRIC THIN FILM, METHOD FOR MAKING THE SAME AND ELECTRIC COMPONENTS THEREOF

(75) Inventors: Toshimasa Suzuki, Gunma (JP); Yoshiki Iwazaki, Gunma (JP); Kentaro Morito, Gunma (JP); Shoichi Sekiguchi, Gunma (JP); Masayuki Fujimoto, Gunma (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 0 days.

(21) Appl. No.: 10/459,558

(22) Filed: Jun. 12, 2003

(65) Prior Publication Data

US 2003/0211741 A1 Nov. 13, 2003

Related U.S. Application Data

(63) Continuation of application No. 09/714,985, filed on Nov. 20, 2000, now abandoned.

(30) Foreign Application Priority Data

Nov. 19, 1999 (JP) .......................................... 11-329768

(51) Int. Cl.[7] .............................................. B32B 9/00
(52) U.S. Cl. ..................................... 428/701; 428/699
(58) Field of Search .............................. 428/701, 689, 428/699; 501/134, 137

(56) References Cited

U.S. PATENT DOCUMENTS 6,151,240 A * 11/2000 Suzuki ....................... 365/145

FOREIGN PATENT DOCUMENTS

| JP | 11-204745 | 7/1999 |
|---|---|---|
| JP | 11-261029 | 9/1999 |

* cited by examiner

Primary Examiner—Jennifer McNeil
Assistant Examiner—A B Sperty
(74) Attorney, Agent, or Firm—McDermott Will & Emery LLP

(57) ABSTRACT

A lattice strain(s) due to lattice mismatch can be effectively utilized and it is further designed for the reduction of leakage current and the improvement of fatigue characteristic.

Substantially one layer of $\{X3\}O$ corresponding to one atomic layer of $\{X3\}O$ is inserted at suitable intervals while epitaxially growing perovskite oxides or $\{X1\}\{X2\}O_3$ layers 12 on a substrate which is similar in crystallographic structure to a desired thin film. $\{X1\}$ and $\{X3\}$ are each Ca or the like, $\{X2\}$ is Ti or the like and $[O]$ is oxygen. While the $\{X3\}O$ layer(s) 14 is introduced so as to divide the perovskite structure of the $\{X1\}\{X2\}O_3$ layers 12, it is present in a condition exhibiting an extremely high structural matching with the perovskite structure thereby forming a layered perovskite structure. The $\{X3\}O$ layer(s) 14 functions as a blocking layer for the introduction of misfit(lattice mismatch) dislocations. As a result, a ferroelectric thin film maintaining high lattice strains is produced.

12 Claims, 6 Drawing Sheets

(A)

(B)

DIELECTRIC THIN FILM, METHOD FOR MAKING THE SAME AND ELECTRIC COMPONENTS THEREOF

This application is a continuation of application Ser. No. 09/714,985 filed Nov. 20, 2000 abandoned.

FIELD OF THE INVENTION

The present invention relates to a dielectric thin film having a perovskite structure, a method for producing the same and an electronic component made therefrom.

BACKGROUND OF THE INVENTION

Oxide thin film materials having the perovskite structure have been used in a wide range of applications such as capacitor elements, ferroelectric memory elements and optical sensors owing to their extremely divergent functions including ferroelectric properties, high permitivity, electro-optical effect, piezoelectric effect, pyroelectric effect and superconductivity. For example, one such suitable application is the use as capacitors for DRAM(dynamic random access memory), MMIC(microwave monolithic integrated circuit) and MCM(multi chip module).

Particularly, the development of memory elements noting the high permitivity characteristic and ferroelectric characteristic of perovskite oxide thin films have recently been in the limelight and studies have been made on their use as DRAM capacitors aiming at high level integration due to reduced capacitor areas as well as their use as nonvolatile ferroelectric memories capable of high speed operation by virtue of hysteresis characteristic due to the ferroelectric properties.

However, the oxide thin film materials of the perovskite structure are crystalline materials in contrast to the conventional amorphous-system materials such as $SiO_2$ and $Si_3N_4$. As a result, high-level thin film crystal growing techniques and defect control techniques are required in order to realize the manifestation of desired characteristics. For instance, $Pb(Zr_mTi_{1-m})O_3$-system materials are used as nonvolatile ferroelectric memory materials since their spontaneous polarization values are high and Curie temperatures are comparatively high, e.g., over 300° C.

In this connection, it has been known that the characteristics are deteriorated markedly due to the formation of cation vacancies due to the volatility of Pb, the formation of oxygen defects in the vicinity of Pt electrode interfaces, the introduction of defects due to such semiconductor process as the formation of passivation films and the like. Particularly, the deterioration of spontaneous polarization due to the polarization reversing cycles or so-called fatigue characteristic is deeply attributable to the above-mentioned defects, thus giving rise to difficult problems in practice. In addition, the Pb-type perovskite has a tendency toward forming a heterogeneous phase having a pyrochlore-type structure which considerably deteriorates ferroelectric properties in the course of thin film low temperature processes, thus also giving rise to a difficult problem in practical use.

On the other hand, $BaTiO_3$ has been well known as a ferroelectric perovskite structure oxide with no Pb and it is extremely stable in structure as compared with the Pb-system perovskite. However, such $BaTiO_3$-system materials are low in spontaneous polarization and their Curie point is 120° C. which is close to room temperature. As a result, the temperature dependency of the polarization amount is extremely large so that these materials have been considered unsuitable for use as nonvolatile capacitors for ferroelectric memory elements.

SUMMARY OF THE INVENTION

In view of the foregoing deficiencies, it is an object of the present invention to provide a dielectric thin film which is stable thermodynamically, capable of effectively utilizing the lattice strain due to lattice mismatch and further capable of realizing reduced leakage current and improved fatigue characteristic, a method of producing the same and an electronic component made therefrom.

[Means of Solving the Problem]

To accomplish the above object, the present invention is characterized in that {X1} having a 12-oxygen atom coordination structure and {X3} which is different in coordination structure from the {X1} are each constituted by at least one element selected from the group consisting of Ca, Mg, Sr, Ba and Pb, that {X2} having a 6-oxygen atom coordination structure is constituted by at least one element selected from the group consisting of Ti and Zr, and that ⌈O⌋ represents oxygen, whereby {X3}O is inserted between perovskite layers having a composition of {X1}{X2}$O_3$ and formed on a substrate of the similar crystallographic structure thereby forming a lattice strain due to the lattice mismatch between the substrate and the layered perovskite film interleaved with {X3}O.

Another invention is characterized in that it consists in a dielectric thin film having a composition of $\{X\}_m\{X2\}O_{2+m}$ (where m>1) wherein {X1} having a 12-oxygen atom coordination structure and {X3} which is different in coordination structure from {X1} are each constituted by at least one element selected from the group consisting of Ca, Mg, Sr, Ba and Pb, and {X2} having a 6-oxygen atom coordination structure is constituted by at least one element selected from the group consisting of Ti and Zr, with {X} representing the total sum of the constituting elements of the {X1} and {X3} and ⌈O⌋ representing oxygen, and the dielectric thin film includes a plurality of perovskite layers having a composition of {X1}{X2}$O_3$ and formed on a substrate similar in crystallographic structure thereto and {X3}O inserted between the perovskite layers, thus causing a lattice strain due to the lattice mismatch between the substrate and the film.

Still another invention is characterized in that {X1} having a 12-oxygen atom coordination structure and {X3} which is different in coordination structure from the {X1} are each constituted by at least one element selected from the group consisting of Ca, Mg, Sr, Ba and Pb, that {X2} having a 6-oxygen atom coordination structure is constituted by at least one element selected from the group consisting of Ti and Zr and that ⌈O⌋ represents oxygen, whereby {X3}O is two-dimensionally or three-dimensionally inserted between perovskite layers having a composition of {X1}{X2}$O_3$.

The above and other objects, features and advantages of the present invention will become apparent from the following detailed description taken with the accompanying drawings.

DETAILED DESCRIPTION

The present invention is susceptible of numerous physical embodiments, depending upon the environment and requirements of use, substantial numbers of the herein shown and described embodiments have been made, tested and used, and all have performed in an eminently satisfactory manner.

<Embodiment 1>

Figure 1:
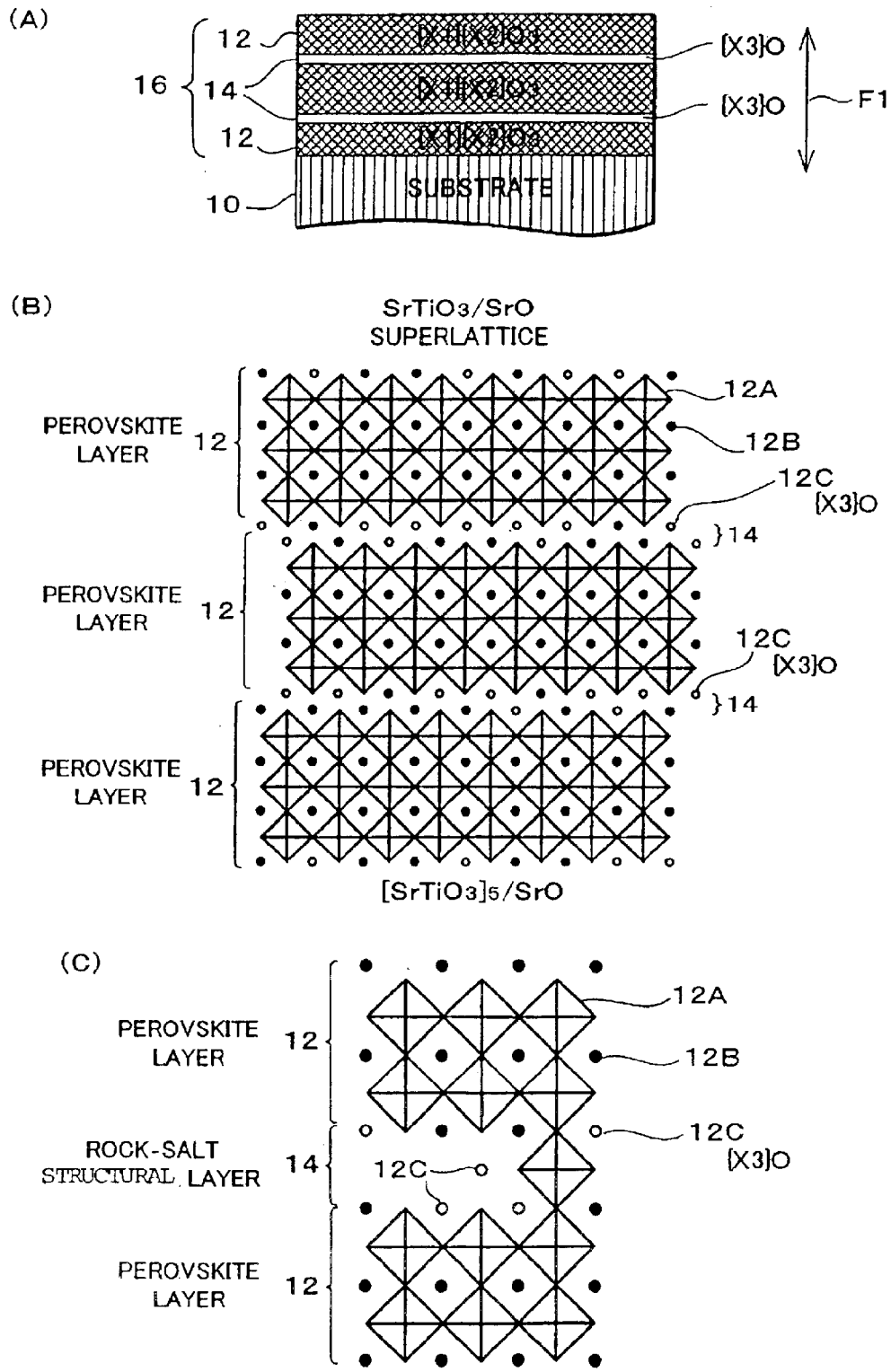
FIG. 1 Diagrams schematically showing a two-dimensional type layered perovskite structure according to the present invention.

Firstly, Embodiment 1 of the present invention will be described in detail. As shown in FIG. 1(A), a single crystal substrate(lower electrode) 10 which is similar in crystallographic structure to a thin film to be formed, e.g., $SrRuO_3$ or $SrTiO_3$ doped(added) with Nb (hereinafter referred to as [Nb—$SrTiO_3$]),is prepared. Then, {X3}O layers 14 each composed of a substantially single atomic layer or substantially single molecular layer are inserted at suitable intervals while epitaxially growing perovskite oxide layers or {X1}{X2}$O_3$ layers 12 on the single crystal substrate 10. Thus, although it dose not always follow that each {X3}O is in a condition that can be referred to as a layer, it is referred to as a ⌈layer⌋ in the following description for purposes of explanation.

Here, {X1} is at least one element selected from the group consisting of Ca, Mg, Sr, Ba and Pb and it has a 12-oxygen atom coordination structure. {X2} is at least one element selected from the group consisting of Ti and Zr and it has a 6-oxygen atom coordination structure. {X3} is at least one element selected from the group consisting of Ca, Mg, Sr, Ba and Pb and it has a coordination structure different from that of the {X1}. ⌈O⌋ represents oxygen.

As shown in FIG. 1(B) or 1(C), the {X3}O layers 14 are inserted so as to divide the perovskite structure of the {X1}{X2}$O_3$ layers 12. In the Figures, octahedrons 12A represent the perovskite structure formed by {X2}$O_6$ oxygen octahedrons and black circles 12B and open circles 12C represent the elements {X1} and {X3}, respectively. However, the element {X3} 12C can easily change position with the adjacent element {X1} 12B. In other words, there is a condition in which the {X3}O is randomly inserted between the perovskite layers 12.

FIG. 1(B) shows a case in which the {X3}O layers 14 are present in the form of rock-salt structure which is extremely high in structural matching with the perovskite structure thereby forming a layered perovskite structure similar to a so-called $K_2NiF_4$ structure. On the contrary, there has been observed such structure which cannot necessarily be said as the rock-salt type structure as shown in FIG. 1(C). In any case, the {X3}O layers 14 of the rock-salt structure function as blocking layers for the introduction of misfit(lattice mismatch) dislocations. Thus, a ferroelectric thin film holding high lattice strains is obtained.

Also, the {X3}O layers 14 of the rock-salt type structure divide a Ti—O bond three-dimensional network which is principal factor for the manifestation of ferroelectric properties and also serves as conducting paths for electrons. As a result, the introduction of the {X3}O layers 14 has the effect of reducing the leakage current and improving the fatigue characteristic. It is to be noted that if the ratio of presence of the {X3}O layers 14 to the {X1}{X2}$O_3$ layers 12 is increased excessively, there is the danger of causing a phenomenon in which the cooperative action between the units of the perovskite structure is deteriorated and the ferroelectric properties are deteriorated considerably.

In addition, the introduction of the {X3}O layers 14 may be effected irregularly so as to form no superlattice structure or alternatively it may be effected so that a superlattice structure results. For instance, if the {X3}O layers 14 are introduced irregularly so that no superlattice structure is formed, no translation symmetry is caused in the film thickness direction(the vertical direction indicated by an arrow F1 in FIG. 1) with the result that the effective critical film thickness is increased and the introduction of misfit dislocations is effectively suppressed. On the contrary, if the {X3}O layers 14 are introduced in such a manner that a superlattice structure results, excellent insulating properties are obtained as will be described later.

When a dielectric thin film 16 having the foregoing multilayer structure is epitaxially grown on the substrate 10 which is similar in crystallographic structure to this dielectric thin film, the thin film is formed with the resulting strained lattice. The lattice strains induced in this way become a factor for producing a new dielectric characteristic. In addition, in this embodiment the strains due to the {X3}O layers 14 are induced as mentioned previously. As a result, these two kinds of strains contribute to-the dielectric properties of the dielectric element according to the present embodiment. Also, as shown in FIG. 1(B), the {X1}{X2}$O_3$ layers 12 and the {X3}O layers 14 can be alternately formed in layers so as to introduce in the dielectric film as many strains corresponding to the number of the inserted rock-salt structural layers or the {X3}O layers 14 and a contribution is also made to the dielectric properties in this respect.

Further, it is possible to construct so that if {X4} of the 12-oxygen atom coordination structure is constituted by at least one element selected from the group consisting of Ca, Mg, Sr, Ba and Pb and {X5} is constituted by cations different from the {X4}, the above-mentioned {X1} is represented by ${X4}_{1-m}{X5}_m$ (where m>0). By so doing, the {X5} acts as an impurity so that strains are caused in the perovskite layers. It is to be noted that the perovskite structure is generally stable with decrease in the amount of the impurity {X5}, that is, if m<0.5.

Then, the production process will be described in greater detail. Firstly, as the substrate 10 serving as the lower electrode, it is possible to quote a conductive $SrTiO_3$ perovskite oxide substrate with the addition of Nb or La. Secondly, it is possible to quote another form in which any one of conductive oxides such as Ca{X91}$O_3$(where {X91}=V, Cr, Fe or Ru), Sr{X92}$O_3$(where {X92}=V, Cr, Fe or Ru), La{93}$O_3$(where {X93}=Ti, Co, Ni or Cu), $La_{1-m}Sr_m${X94}$O_3$(where {X94}=V, Mn or Co and m>0.23), $BaPbO_3$, $SrRuO_3$, $SrIrO_3$, $Sr_2RuO_4$, $Sr_2IrO_4$ or $(La_{1-m}Sr_m)_2CuO_4$ (where m<0.3) is epitaxially grown on an insulative perovskite single crystal substrate such as MgO, $SrTiO_3$ or $LaAlO_3$.

Further and thirdly, it is possible to quote still another form in which any one of conductive oxides such as Ca{X95}$O_3$(where {X95}=V, Cr, Fe or Ru), Sr{X96}$O_3$ (where {X96}=V, Cr, Fe or Ru), La{X97}$O_3$(where {X97}= Ti, Co, Ni or Cu), $La_{1-m}Sr_m${X98}$O_3$ (where {X98}=V, Mn or Co and m>0.23), $BaPbO_3$, $SrRuO_3$, $SrIrO_3$, $Sr_2RuO_4$, $Sr_2IrO_4$ or $(La_{1-m}Sr_m)_2CuO_4$(where m<0.3) is grown epitaxially on the barrier layer or epitaxial oxide such as $MgAl_2O_4$, MgO, $CeO_2$, $\alpha$—$Al_2O_3$ or YSZ(yttrium stabilized zirconium) on a semiconductor Si substrate.

The dielectric thin film 16 is formed on the thusly formed substrate 10 by such thin film fabrication process as the laser ablation process, MBE(molecular beam epitaxy) process or sputtering process. More specifically, a multilayer thin film of the {X1}{X2}O$_3$ layers 12 and {X3}O layers 14 is formed. The {X3}O layers 14 are formed by utilizing the well known atomic layer control. In the case of the laser ablation process, for example, substantially a single atomic layer or so is formed by controlling the output power of a laser and the number of pulses. Similarly, substantially a single atomic layer or so is formed by controlling the output power of plasma and the sputtering time in the case of sputtering and by controlling the amount of gas in the case of CVD, respectively. While, in these cases, the film formation control of the {X3}O layers 14 is difficult technically, it has been confirmed that some variation in the amount of supply of {X3}O can be tolerated by forming the {X3}O layers 14 in the film thickness direction. In addition, as will be described later, the formation of three-dimensionally grown {X3}O layers(See FIG. 2) can be easily effected by causing the composition of {X1}{X2}O$_3$ layers 12 to contain excess {X1}O during the period of film formation.

Figure 3:
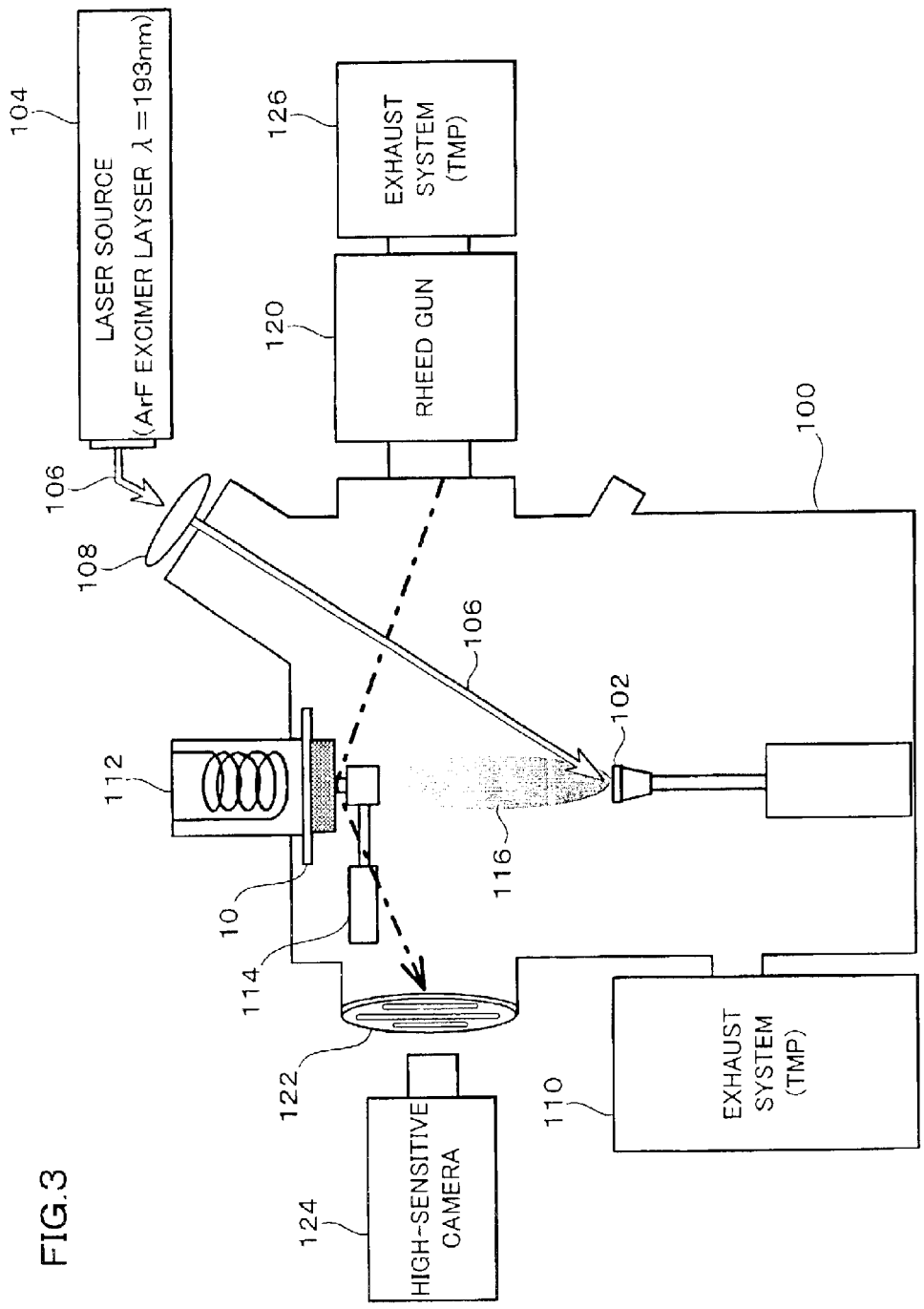
FIG. 3 A block diagram showing an example of an apparatus for manufacturing dielectric thin films of the perovskite structure.

FIG. 3 shows an example of an apparatus for manufacturing the dielectric thin film according to the present embodiment. This apparatus is so designed that a perovskite compound is deposited on a film-forming substrate by the laser ablation process, thereby manufacturing a dielectric thin film of a layered perovskite structure. In the Figure, a target 102 is disposed within a vacuum chamber 100 and a film-forming substrate 10 is arranged so as to be apart from the target 102 by a given distance. An oxygen gas or ozone may be introduced into the vacuum chamber 100 in case of need. An ArF excimer laser having a wavelength $\lambda=193$ nm is used as a laser source 104, for example. It is constructed so that a laser beam 106 emitted from the laser source 104 is irradiated on the target 102 through an optical system 108 including a mirror, lens, etc.

The vacuum chamber 100 is vacuum evacuated by an exhaust system 110 such as a TMP(turbo molecular pump), and an infrared heater 112 is installed for heating the film-forming substrate 10. Also, a film thickness monitor 114 is disposed in the vicinity of the surface of the film-forming substrate 10. In addition, a RHEED(reflection high velocity electron beam diffraction) gun 120, a RHEED screen 122 and a high-sensitive camera 124 are installed as analytical instruments, and the RHEED gun 120 is evacuated by an exhaust system 126.

As the target 102, a product produced by the conventional powder sintering technique e.g., a ceramic sinter or powder press molding is used. Such sinter is obtained by mixing raw material powders to attain a desired composition and then subjecting the mixture to pre-sintering, molding and sintering processes. The powder press molding is a product obtained by press molding without effecting the sintering process.

When the laser beam 106 is irradiated onto the target 102, the target 102 scatters its steam into an oxygen atmosphere as indicated by a plume 116 so that a thin film of practically the same composition as the target 102 is formed on the opposing film-forming substrate 10.

By preparing, for example, sinters of perovskite oxide SrTiO$_3$ and sinters(or press moldings) of SrO as the targets 102 and alternately using them to form a multilayer film on the substrate 10, a layered perovskite oxide thin film two-dimensionally including the SrO layers is produced. Its specific cases will be described later by way of examples.

<Embodiment 2>

Next, Embodiment 2 of the present invention will be described. This embodiment is designed so that in the previously mentioned layered perovskite oxide the {X3} ions in the insertion layers or {X3}O layers 14 are substituted by {X1}' element differing in ion radius from the {X1} ions in the matrix layers or {X1}{X2}O$_3$ layers 12. Here, the {X1}' is at least one element selected from the group consisting of Ca, Mg, Sr, Ba and Pb. By so doing, lattice strains other than those caused by the lattice mismatch between the substrate 10 and the thin film 16, that is, strains due to the difference in ion radius are effectively introduced.

As regards the ion radius of the {X1}' ions, it may be either greater or smaller than the ion radius of the {X1} in the matrix layers or {X1}{X2}O$_3$ layers 12. However, the crystallographic structure can be stabilized by selecting those ions which are smaller in ion radius than the {X1} ions in the matrix layers or {X1}{X2}O$_3$ layers 12.

Generally, considering from the simple geometrical point of view, the structural stability of an ionic crystal can be analogized from the ion radii of the constituent elements and the elements higher in ion radius can be stabilized more in proportion to the increase in coordination number. On the other hand, in the dielectric thin film of the above-mentioned structure the {X3} ions of the inserted {X3}O layers 14 are smaller in coordination number than the {X1} ions of the perovskite structure {X1}{X2}O$_3$ layers 12. As a result, the {X1}' element of the smaller ion radius tend to preferentially occupy the cation sites of the {X3}O layers 14 thereby stabilizing the crystallographic structure. By utilizing this phenomenon, it is possible to more stably form the layered perovskite oxide of the present embodiment. Also, by varying the ratio between the ion radii of the {X1} ions and the {X1}' ions within the limits that permit the maintenance of the structural stability, it is possible to effectively control the lattice strains.

Further, in order to introduce the desired lattice strains effectively, a part of the {X1} ion elements in the {X1}{X2}O$_3$ layers 12 may be replaced with [R] ions of a different ion radius. At least one element selected from the group consisting of rare earth elements, e.g., La, Nd, Pm, Sm, Eu, Gd, Tb, Dy and Ho is suitable as the [R] ions. With the dielectric thin film of this construction, greater lattice strains are induced and excellent characteristics such as a high spontaneous polarization are obtained owing to a synergistic action of the lattice strains by the {X3}O layers 14 and the lattice strains due to partial introduction of the [R] ions which are different in ion radius from the {X1} ions. As the result of the partial introduction of the [R] ions having a different valence number, it is possible to suppress the formation of carriers due to oxygen deficiency and the like.

In addition, the crystallographic structure is more stabilized if any element which is small in ion radius is preferentially introduced in a greater amount. For instance, this is accomplished in a manner that CaO is introduced in the case of the perovskite layer composed of BaTiO$_3$.

<Embodiment 3>

Figure 2:
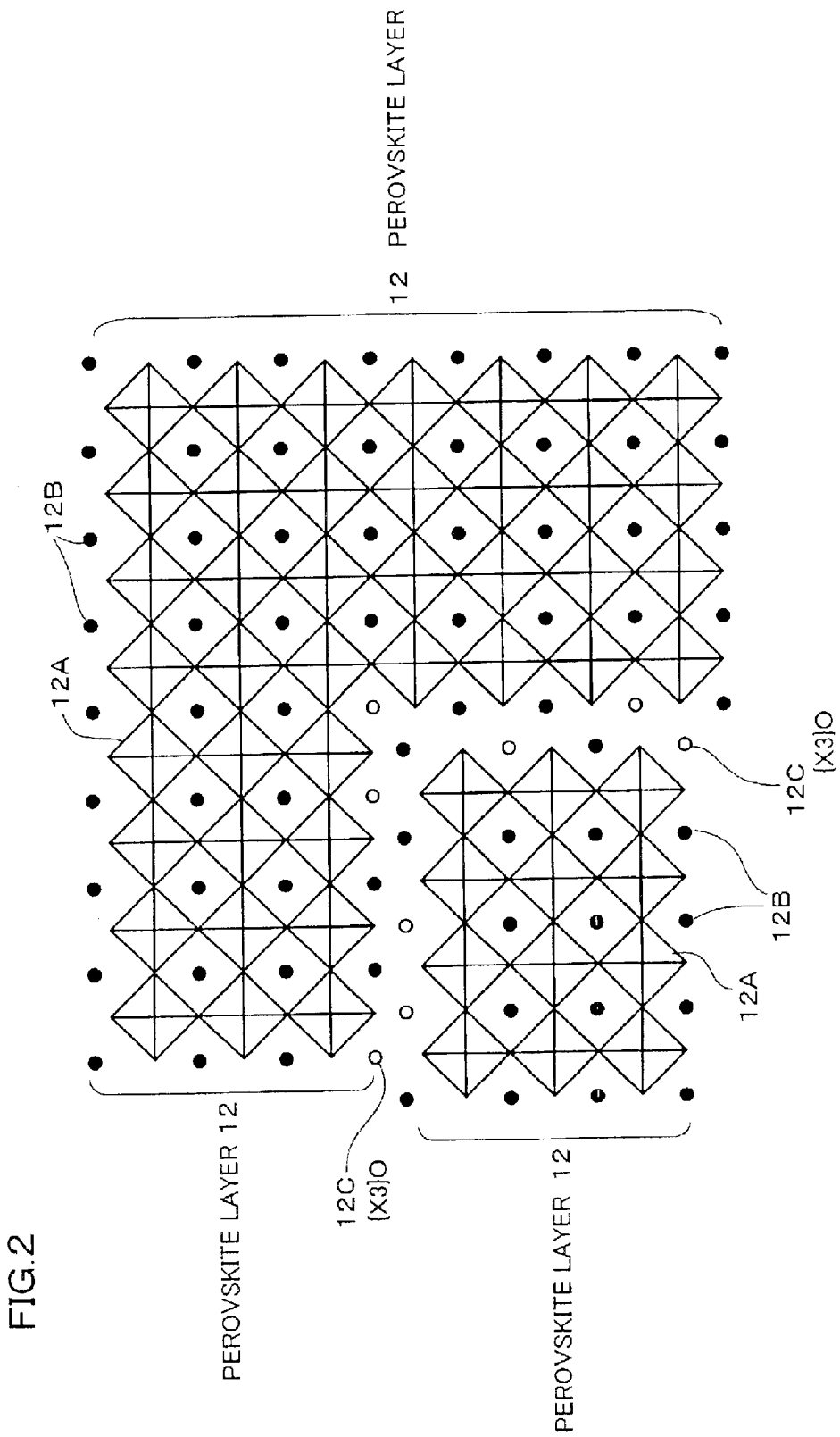
FIG. 2 A diagram schematically showing a three-dimensional type layered perovskite structure.

Next, Embodiment 3 of the present invention will be described. While, in the previously mentioned embodiments, the {X3}O layers 14 are two-dimensionally introduced into the {X1}{X2}O$_3$ layers 12, it is possible to produce a crystalline thin film including {X3}O layers by simply causing the composition of a thin film represented by {X}{X2}O$_3$ to include excess {X}O. In this case, however, the {X3}O layers 14 are introduced three dimensionally and disorderedly into the matrix layers or {X1}{X2}O$_3$ layers 12 of the perovskite structure as shown in FIG. 2. Also, this embodiment is the same as the previously mentioned embodiments in that the {X3}O layers 14 function as layers for blocking the introduction of misfit dislocations. It is to be noted that this three-dimensional structure is such that the composition of the thin film as a whole is a {X3}-site-excess composition.

Also, where the {X1} ions are composed of a combination of at least two elements of different ion radii in the present embodiment, that is, these ions are expressed as $(\{X1\}'_n\{X1\}''_{m-n})\{X2\}O_{2+m}$, the crystallographic structure can be stabilized by causing the {X1}' element of the smaller ion radius to be selectively precipitated at the {X3} cation positions of the {X3}O layers 14. Here, the {X1}' and {X1}" are each constituted by at least one element selected from the group consisting of Ca, Mg, Sr, Ba and Pb, and m>1 and n>0. It is assumed that the ion radius of the {X1}' element is smaller than that of the {X1}" element.

According to the present embodiment, the crystallographic structure is also stabilized if the element of the smaller ion radius is introduced preferentially in a greater amount in the {X3}O layer. This can be attained in such a manner that as for example,the perovskite layer is expressed by $(Sr_{m1}Ca_{s1})TiO_3$(where m1+s1=1) and the {X3}O layer is expressed by $(Sr_{m2}Ca_{s2})O$(where m2<s2).

EXAMPLES

Examples of the present invention will now be described.

Example 1

In Example 1, an ArF excimer laser having a wavelength of 193 nm was used as the laser source 104 shown in FIG. 3. In the process of film formation, the pressure of oxygen atmosphere was selected 1.3 Pa and the temperature of a substrate 10 was selected 600° C. An Nb—SrTiO$_3$ single crystal substrate employing the (100) face as a surface(film-forming surface) was used as the substrate 10, and two kinds of products including sinters of perovskite oxide SrTiO$_3$ and powder press moldings of SrO were prepared as the targets 102. Laser ablation was effected by using these products and thus a layered perovskite dielectric thin film of the superlattice structure two-dimensionally including SrO layers was formed on the substrate 10.

Figure 4:
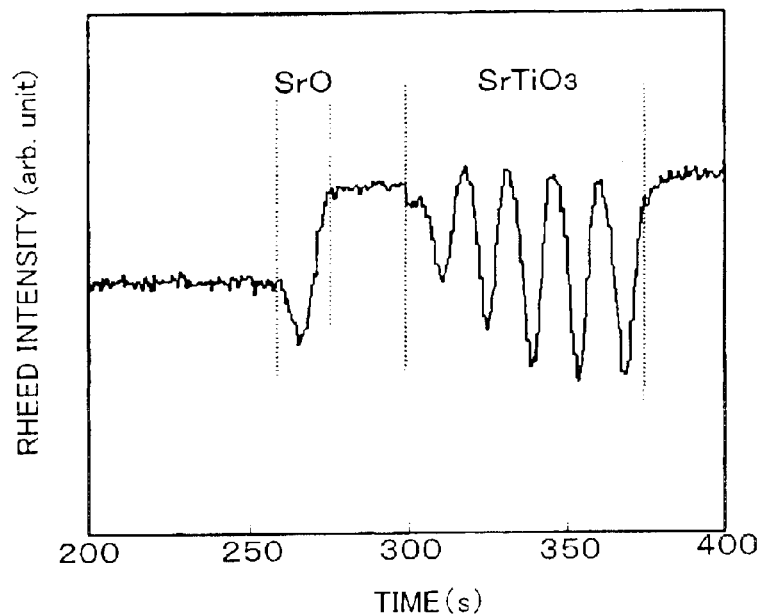
FIG. 4 Graphs showing exemplary RHEED intensity and X-ray diffraction intensity measurements in an example of a superlattice structure.
Figure 4:
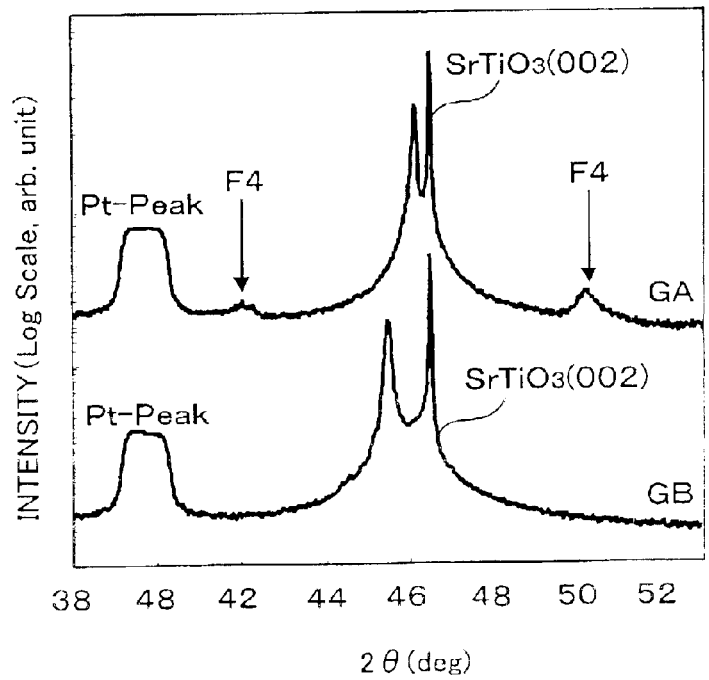

More specifically, the dielectric thin film was formed in such a manner that five layers of SrTiO$_3$ were formed and substantially a single unit of SrO layer was formed. FIG. 4(A) shows the manner in which the RHEED intensity varied with time and it will be seen from the intensity variation pattern that substantially one layer of SrO was formed and substantially five layers of SrTiO$_3$ were formed on the former.

Further, with the dielectric thin film obtained in this way, a high resolution transmission electron microscopy(TEM) image of its section was examined and thus it was confirmed at the atomic layer level that the SrO insertion layer of a rock-salt type structure was two-dimensionally formed within the SrTiO$_3$ crystal of the perovskite structure. Also, it was seen that this dielectric thin film included not only the structure in which the SrO layers and the SrTiO$_3$ layer were simply arranged alternately in layers in one direction but also the formation of SrO layer having three-dimensionally vertical relation and induced thermally.

On the other hand, a comparative dielectric thin film was formed under the same conditions by using $Sr_6Ti_5O_{16+m}$ for the targets 102. By so doing, an SrO-excess three-dimensionally inserted perovskite film was obtained.

Then, a comparison was made between the previously mentioned superlattice perovskite film of SrTiO/SrO and SrO-excess perovskite film. The results of X-ray diffraction became as shown in FIG. 4(B). In the Figure, the graph GA represents the diffraction results of the superlattice perovskite film and the graph GB represents the diffraction results of the SrO-excess perovskite film. As will be seen from the comparison between the two films, the peaks indicated by arrows F4 are present and there is the period of the superlattice in the superlattice perovskite film.

Figure 5:
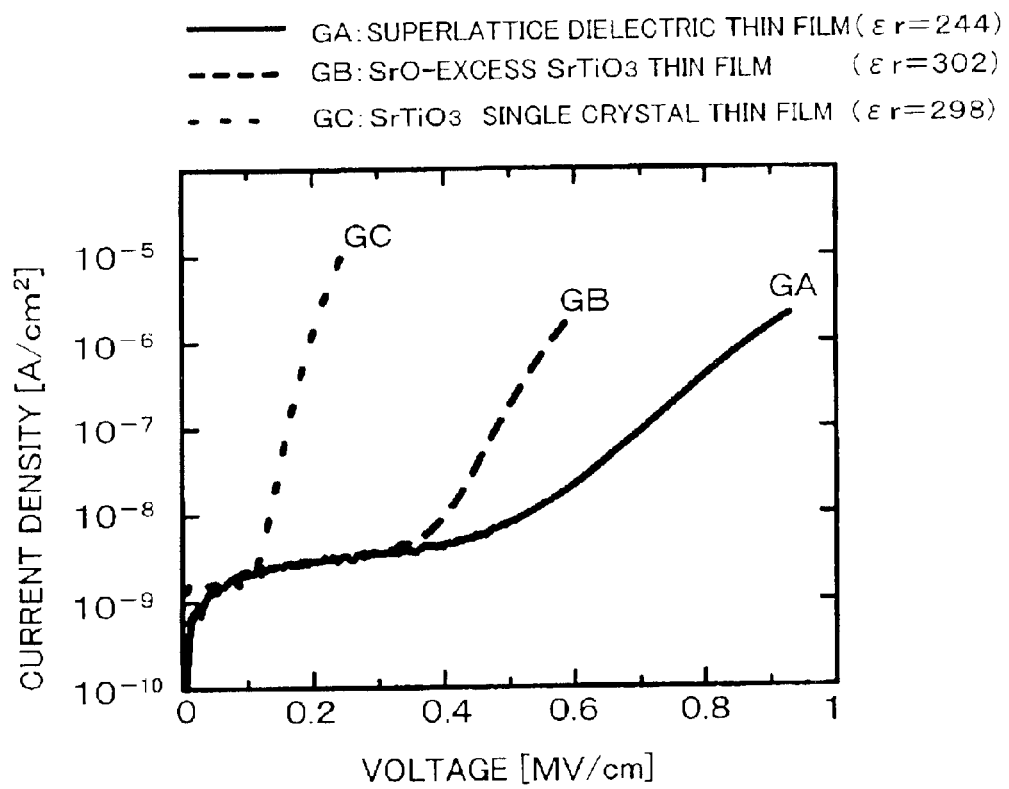
FIG. 5 A graph showing the results of a comparison in electric characteristic between a superlattice perovskite film and an SrO-excess perovskite film.

Next, a comparison made between the exemplary electric characteristics of the two films showed the results as shown in FIG. 5. Note that the electric characteristics of this Figure were measured by forming an electrode of platinum on each of the two perovskite films. In the Figure, the solid line graph GA represents the electric characteristic of the superlattice perovskite film(specific permitivity $\epsilon r$=244), the dotted line graph GB the characteristic of the SrO-excess perovskite film(specific permitivity $\epsilon r$=302) and the chain line graph GC the characteristic of the perovskite single crystal of the stoichiometric composition SrTiO$_3$(specific permitivity $\epsilon r$=298).

Referring to FIG. 5, the amounts of current density upon the application of voltages were examined first and the results showed that the superlattice perovskite film was smallest in current density. A significantly large SrO-excess perovskite film($Sr_{1.5}TiO_{3.5}$) also exhibited the improved leakage current characteristic equivalent to that of the superlattice perovskite film, but their permitivity(specific permitivity $\epsilon r$=106) is considerably deteriorated. Thus, it follows that the formation of the superlattice structure has the effect of greatly improving the voltage withstanding properties despite some deterioration of the capacitance.

Example 2

In this Example, perovskite layers were constituted by $(\{Ba_{0.8}Ca_{0.2}\}_{0.98}\{La\}_{0.02})TiO_3$ and SrO was introduced into the former. More specifically, sinters of $(\{Ba_{0.8}Ca_{0.2}\}_{0.98}\{La\}_{0.02})TiO_3$ and sinters of SrO were prepared as targets so that in the like manner as the previously mentioned example, laser ablation was effected by using these sinters alternately and thus a layered perovskite dielectric thin film two-dimensionally including SrO rock-salt type structure layers was formed on a substrate. As a result, the $\{La\}_{0.02}$ acted as an impurity thus causing strains in the perovskite layers.

Example 3

In this Example, a dielectric thin film was produced by using $Sr_{1.5}TiO_{3.5}$ sinters having a {X1} ion-excess composition as the targets 102. Note that also in this Example, a substrate 10 was an Nb—SrTiO$_3$ single crystal substrate as in the case of the previously mentioned Examples and the substrate temperature was 600° C.

A transmission electron microscope image of the section of the resulting dielectric thin film was examined and thus it was confirmed at the atomic layer level that SrO having excellent structural matching properties were formed three-dimensionally within the perovskite structure. Also, as a result of the examination of a selected-area electron beam diffraction image, the presence of cross-type streak spots suggesting the formation of a layered perovskite structure was confirmed.

With the dielectric thin film of this Example, while the lattice constant was increased in a three-dimensional isotropic manner, no misfit dislocations were introduced due to the blocking effect of the SrO layers. In addition, the thin film lattice was completely limited two-dimensionally to the lattice of the substrate 10 and a in-plane compressive stress of about 1 GPa was caused within the thin film.

Example 4

In this Example, two kinds of sinters including $BaTiO_3$ sinters and SrO sinters were used as the targets 102 and a dielectric thin film was produced in which SrO layers were irregularly introduced into $BaTiO_3$ layers. An $SrTiO_3$ single crystal substrate adapted to function as a lower electrode was used as the base material of a substrate 10. $SrRuO_3$ or conductive perovskite was epitaxially grown on this base material thereby using it as the substrate 10 and the substrate temperature was selected 600° C.

The dielectric thin film obtained in this manner showed that no misfit dislocations were introduced due to the introduction of the SrO layers, that the thin film lattice was completely limited two-dimensionally to the lattice of the substrate 10 and that high level ferroelectric properties were exhibited.

Example 5

In this Example, $\{Sr_{0.8}Ca_{0.2}\}_{1.1}TiO_{3.1}$ was used as the target 102. By so doing, a three-dimensionally inserted perovskite film including excess $\{Sr_{0.8}Ca_{0.2}\}$ was formed.

Example 6

Figure 6:
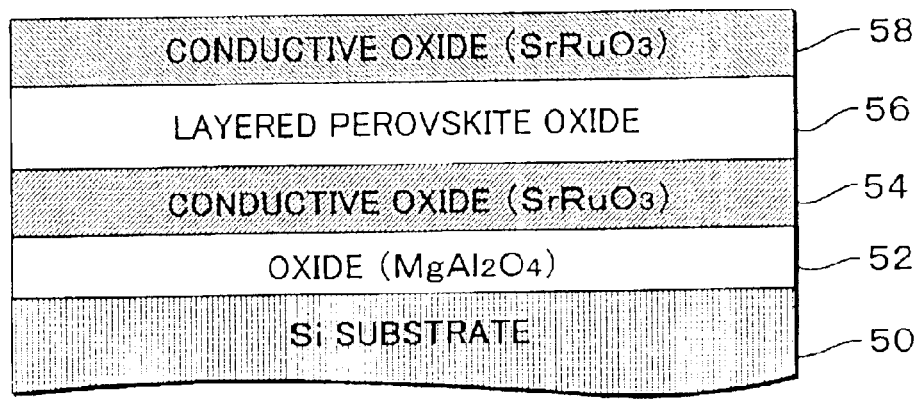
FIG. 6 A diagram showing the principal construction of a dielectric memory element to which the present invention is applied.

Next, description will be made of an example in which the dielectric thin film of the present invention was used in a ferroelectric nonvolatile memory. As shown in FIG. 6, this nonvolatile memory had a layered structure in which an oxide film or $MgAl_2O_4$ film 52, a conductive oxide film or $SrRuO_3$ film 54, a layered perovskite film 56 according to the present invention and a conductive oxide film or $SrRuO_3$ film 58 were formed in layers on a Si substrate 50. In this case, the two $SrRuO_3$ films 54 and 58 functioned as upper and lower electrodes, and the $MgAl_2O_4$ film 52 functioned as a buffer layer for the film formation on the Si substrate 50.

With the dielectric memory element constructed in this way, the $MgAl_2O_4$ film 52 was epitaxially grown with a perfect face orientation relation on the Si substrate 50 and the $SrRuO_3$ film 54 was further grown on the film 52. The $SrRuO_3$ film 54 was adapted to function as a conductive oxide electrode of the perovskite structure. Since the ferroelectric oxide layers of $\{Ba_{0.3}Sr_{0.7}\}TiO_3$ and SrO were formed in layers on this electrode, the perovskite film 56 was easily grown epitaxially.

Thus, with the ferroelectric memory element of this Example, by virtue of the excellent leakage characteristic and strain-induced ferroelectric characteristic of the layered perovskite structure according to the present invention as well as the realization of the ferroelectric film-oxide electrode interfaces having the complete lattice matching, there is the effect of avoiding the problem of adhesion between the ferroelectric film and the electrodes and the diffusion of such constituent elements tending to induce the deterioration of fatigue characteristics, particularly oxygen which have been encountered in cases using Pt electrodes.

<Other Embodiments>

The present invention involves a number of other embodiments and it can be modified in a variety of ways in accordance with the foregoing disclosure. For instance, the following are involved.

(1) While the above-mentioned examples have been described mainly in connection with the laser ablation process, the similar layered perovskite structure can be realized through the application of artificial superlattice techniques for the film formation of a two-dimensional periodic structure having a desired composition on the order of atomic/molecular layer. In this case, while an $SrTiO_3$ thin film of the perovskite structure is formed by alternately forming SrO molecular layers and $TiO_3$ molecular layers in layers, a layered perovskite structure according to the present invention can be obtained by adding substantially one excess SrO molecular layer to such thin film.

(2) In the above-mentioned Example 4, the $MgAl_2O_4$ film 52 was used as a buffer layer which was epitaxially grown on the Si substrate 50 and on which the conductive oxide of the perovskite structure was epitaxially grown. However, the buffer layer is not limited thereto and it is possible to use a variety of oxides capable of epitaxial growth on the Si substrate depending on the lattice matching properties of the conductive substrate used. For instance, MgO, $CeO_2$, α—$Al_2O_3$ and YSZ(yttrium stabilized zirconium) can be used.

Also as regards the conductive oxide 54 epitaxially grown on the buffer layer 52, various oxides of the perovskite structure can be used in consideration of the lattice matching properties for the layered perovskite oxide 56 above it and the buffer layer 52 below it. For instance, applicable conductive perovskite oxides include $Ca\{X81\}O_3$(where $\{X81\}$=V, Cr, Fe or Ru), $Sr\{X82\}O_3$(where $\{X82\}$=V, Cr, Fe or Ru), $La\{X83\}O_3$ (where $\{X83\}$=Ti, Co, Ni or Cu), $La_{1-m}Sr_m\{X84\}O_3$(where $\{X84\}$=V, Mn or Co and m>0.23), $BaPbO_3$, $SrRuO_3$, $SrIrO_3$, $Sr_2RuO_4$, $Sr_2IrO_4$ and $(La_{1-m}Sr_m)_2CuO_4$(where m<0.3).

(3) While Example 4 has been described as applied to a dielectric memory element by way of example, the present invention is not limited thereto and the invention can be applied to the dielectric thin films of various electronic components. For instance, the invention can be applied to a DRAM capacitor or MCM decoupling capacitor thereby improving the function of such component.

As described hereinabove, in accordance with the present invention the following effects can be obtained.

(1) Since $\{X3\}O$ is formed and inserted between perovskite layers having a composition of $\{X1\}\{X2\}O_3$, a lattice strain due to the lattice mismatch between a substrate and the layered perovskite film can be effectively utilized and a reduced leakage current and improved fatigue characteristics can also be attained.

(2) By effecting the substitution of ions in consideration of ion radius, it is possible to effectively introduce a lattice strain to thereby attain an improved spontaneous polarization.

(3) Since both the $\{X3\}O$ and the perovskite layers are formed into a superlattice structure, the rated withstand voltage can be improved.

What is claimed is:

1. A dielectric thin film characterized in that $\{X1\}$ having a 12-oxygen atom coordination structure and $\{X3\}$ which is different in coordination structure from said $\{X1\}$ are each constituted by at least one element selected from the group consisting of Ca, Mg, Sr, Ba and Pb, where $\{X1\}\neq\{X3\}$, that $\{X2\}$ having a 6-oxygen atom coordination structure is constituted by at least one element selected from the group consisting of Ti and Zr, and that O presents oxygen, whereby $\{X3\}O$ is inserted between perovskite layers having a composition of $\{X1\}\{X2\}O_3$ and formed on a substrate similar in crystallographic structure thereto to induce lattice strains due to lattice mismatch between said layered perovskite film and said substrate.

2. A dielectric thin film as set forth in claim 1, characterized in that said perovskite layers are divided into a plurality of layers by the insertion of said $\{X3\}O$.

3. A dielectric film as set forth in claim 1, characterized in that substantially one layer of said {3} is inserted.

4. A dielectric thin film as set forth in claim 1, characterized in that the {X3}O layer is present in the form of rock-salt structure.

5. A dielectric thin film as set forth in claim 1 characterized in that said perovskite layers and said {X3}O are alternately formed in layers to form a superlattice structure.

6. A dielectric thin film as set forth in claim 1, characterized in that {X4} having a 12-oxygen atom coordination structure is constituted by at least one element selected from the group consisting of Ca, Mg, Sr, Ba and Pb and that {X5} is constituted by an element different from said {X4} whereby said {X1} is represented by ${X4}_{1-m}{X5}_m$ (where m>0).

7. A dielectric thin film as set forth in claim 6, characterized in that said m is selected m<0.5.

8. A dielectric thin film as set forth in claim 1, characterized in that said {X3} is constituted by an element smaller in ion radius than an element constituting said {X1}.

9. A method of producing a dielectric thin film as set forth in claim 1, characterized in that said perovskite layers and said {X3}O are epitaxially grown on a substrate of a similar crystallographic structure by alternately using first and second targets.

10. An electronic component comprising the dielectric thin film as set forth in claim 1.

11. A dielectric thin film characterized in that {X1} having a 12-oxygen atom coordination structure and {X3} which is different in coordination structure from said {X1} are each constituted by at least one element selected from the group consisting of Ca, Mg, Sr, Ba and Pb, that {X2} having a 6-oxygen atom coordination structure is constituted by at least one element selected from the group consisting of Ti and Zr, and that O represents oxygen, whereby a plurality of layers composed of {X3}O are inserted among perovskite layers having a composition of ${X1}{X2}O_3$, said perovskite layers being formed on a substrate similar in crystallographic structure thereto, to thereby induce lattice strains due to lattice mismatch between said layered perovskite film and said substrate.

12. An electronic component comprising the dielectric thin film as set forth in claim 11.

\* \* \* \* \*

UNITED STATES PATENT AND TRADEMARK OFFICE
CERTIFICATE OF CORRECTION

PATENT NO. : 6,824,898 B2  
DATED : November 30, 2004  
INVENTOR(S) : Toshimasa Suzuki et al.

Page 1 of 1

It is certified that error appears in the above-identified patent and that said Letters Patent is hereby corrected as shown below:

Column 11,
Line 2, change "{3}" to -- {X3}O --.

Signed and Sealed this

Seventeenth Day of May, 2005

JON W. DUDAS
*Director of the United States Patent and Trademark Office*